(12) United States Patent
Terui et al.

(10) Patent No.: US 7,545,036 B2
(45) Date of Patent: Jun. 9, 2009

(54) SEMICONDUCTOR DEVICE THAT SUPPRESSES VARIATIONS IN HIGH FREQUENCY CHARACTERISTICS OF CIRCUIT ELEMENTS

(75) Inventors: Makoto Terui, Yamanashi (JP); Noritaka Anzai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/528,335

(22) Filed: Sep. 28, 2006

(65) Prior Publication Data

US 2007/0021089 A1 Jan. 25, 2007

Related U.S. Application Data

(62) Division of application No. 10/289,384, filed on Nov. 7, 2002, now Pat. No. 7,157,794.

(30) Foreign Application Priority Data

Apr. 3, 2005 (JP) ............................... 2002/101063

(51) Int. Cl.
*H01L 23/12* (2006.01)
*H01L 23/48* (2006.01)
*H01L 27/04* (2006.01)
*H01L 29/40* (2006.01)
*H01L 23/52* (2006.01)

(52) U.S. Cl. ............................... 257/728; 257/E23.004; 257/E23.021; 257/E23.06; 257/E23.101; 257/E23.114; 257/737; 257/738; 257/778; 257/692; 257/693; 257/681; 257/698; 257/786; 257/779

(58) Field of Classification Search ............... 257/728, 257/E23.004, E23.021, E23.06, E23.101, 257/E23.14, 737, 738, 778, 692, 693, 681, 257/698, 786, 779
See application file for complete search history.

(56) References Cited

U.S. PATENT DOCUMENTS

| 5,814,894 | A | 9/1998 | Igarashi et al. |
| 5,959,357 | A | 9/1999 | Korman |
| 5,990,546 | A | 11/1999 | Igarashi et al. |
| 6,326,673 | B1 | 12/2001 | Liou |
| 6,384,479 | B1 | 5/2002 | Yamamoto |
| 6,504,096 | B2 | 1/2003 | Okubora |

(Continued)

FOREIGN PATENT DOCUMENTS

EP 0543282 A1 5/1993

(Continued)

*Primary Examiner*—Alexander O Williams
(74) *Attorney, Agent, or Firm*—Volentine & Whitt, P.L.L.C.

(57) ABSTRACT

A semiconductor device includes a semiconductor substrate having a main surface, the main surface including a first and second areas formed with a high-frequency circuit element, and a third area located around the first and second areas and formed with a low-frequency circuit element. The semiconductor device also includes a sealing resin which covers the main surface; a plurality of first external terminals which are formed above the third area and which are electrically connected to the high-frequency circuit element, the first external terminals protruding from the surface of the sealing resin. The semiconductor device further includes a plurality of second external terminals which are formed above the third area and which are electrically connected to the low-frequency circuit element, the second external terminals protruding from the surface of the sealing resin.

9 Claims, 10 Drawing Sheets

U.S. PATENT DOCUMENTS

| | | |
|---|---|---|
| 6,521,485 B2 | 2/2003 | Su et al. |
| 6,545,457 B2 | 4/2003 | Goto et al. |
| 6,555,921 B2 | 4/2003 | Kwon et al. |
| 6,661,078 B2 | 12/2003 | Shitara |
| 6,847,066 B2 | 1/2005 | Tahara et al. |
| 6,870,256 B2 | 3/2005 | Aoki et al. |
| 2001/0020737 A1 | 9/2001 | Kwon et al. |
| 2001/0026021 A1 | 10/2001 | Honda |
| 2002/0094601 A1 | 7/2002 | Su et al. |
| 2002/0121689 A1 | 9/2002 | Honda |
| 2002/0159242 A1* | 10/2002 | Nakatani et al. ............ 361/760 |
| 2002/0180062 A1 | 12/2002 | Hsieh et al. |
| 2003/0116790 A1 | 6/2003 | Kikuchi et al. |
| 2004/0119140 A1 | 6/2004 | Nishijima |
| 2005/0221622 A1* | 10/2005 | Shioya et al. ............... 438/758 |

FOREIGN PATENT DOCUMENTS

| | | |
|---|---|---|
| JP | 56-45070 | 4/1981 |
| JP | 08-111506 | 4/1996 |
| JP | 9-306947 | 11/1997 |
| JP | 2000-124358 | 4/2000 |
| JP | 2000-235979 A * | 8/2000 |
| JP | 20002235979 A | 8/2000 |
| JP | 200144367 | 2/2001 |
| JP | 2001060642 A | 3/2001 |
| JP | 2001156209 A | 6/2001 |
| JP | 2001-284400 | 10/2001 |
| JP | 200226177 | 1/2002 |
| JP | 200257292 | 2/2002 |
| JP | 2002083894 A | 3/2002 |
| JP | 20021644678 A | 6/2002 |
| JP | 2002231817 | 8/2002 |

\* cited by examiner

SEMICONDUCTOR DEVICE THAT SUPPRESSES VARIATIONS IN HIGH FREQUENCY CHARACTERISTICS OF CIRCUIT ELEMENTS

CROSS REFERENCE TO RELATED APPLICATIONS

This is a divisional application of application Ser. No. 10/289,384, filed Nov. 7, 2002, now U.S. Pat. No. 7,157,794, which is hereby incorporated by reference in its entirety for all purposes. This application is also related to copending application Ser. No. 10/419,114.

BACKGROUND OF THE INVENTION

1. Field of the Invention

The present invention relates to a semiconductor device, and particularly to a semiconductor device capable of suppressing a variation in high-frequency characteristic.

This application is counterpart of Japanese patent applications, Serial Number 101063/2002, filed Apr. 3, 2002, the subject matter of which is incorporated herein by reference.

2. Description of the Related Art

With the scale down of a portable device, there has been a demand for a reduction in size of a semiconductor device mounted in the portable device. In order to meet the need thereof, a semiconductor device called a Chip Size Package having outer dimensions substantially identical to those of a semiconductor chip has been brought into sight As one form of the Chip Size Package, there exists a semiconductor device called a Wafer Level Chip Size Package or a Wafer Level Chip Scale Package.

A structure of such a Wafer Level Chip Size Package (hereinafter called "WCSP") will be described using FIGS. 1 through 3.

FIG. 1 is a plan view showing the conventional WCSP prior to being sealed with an sealing resin, and FIG. 2 is a plan view illustrating the conventional WCSP subsequent to having been sealed with the sealing resin, respectively. FIG. 3 is a schematic cross-sectional view taken along line 3-3 in each of FIGS. 1 and 2.

The conventional WCSP has a semiconductor substrate 101. An electronic circuit comprising transistors, resistors, capacitors, inductors, etc. is formed on the surface of the semiconductor substrate 101. A plurality of electrode pads 103 connected to the electronic circuit are formed on the surface of the semiconductor substrate 101.

An insulating layer 301 composed of silicon oxide or the like is formed on the semiconductor substrate 101 excluding some of the surfaces of the electrode pads 103. A protective film 303 composed of polyimide or the like is formed on the insulating layer 301. Owing to such a structure, some of the surfaces of the electrode pads 103 are exposed by openings defined by the insulating layer 301 and the protective film 303.

One ends of wiring layers 105 composed of, for example, copper, are connected to their corresponding electrode pads 103 via the openings of the insulating layer 301. The wiring layers 105 extend over the protective film 303 so as to range from the electrode pads 103 to lower portions of columnar electrodes 305. The other ends of the wiring layers 105 are respectively pad portions 111 disposed below the columnar electrodes 305 and external terminals 201. The pad portions 111 are placed in positions near a central area of the semiconductor substrate 101 as viewed from the electrode pads 103.

The wiring layers 105 respectively perform the function of substantially shifting the positions of the external terminals 201 from a peripheral portion of the semiconductor substrate 101 to the central area of the semiconductor substrate 101. In general, such a shift is called "relocation". Therefore, the wiring layers each of which performs such a shift, are called "relocating wirings or re-distribution wirings". The wiring layers 105 will be called "re-distribution wirings 105" below.

The columnar electrodes 305 composed of, for example, copper are formed on their corresponding pad portions 111 of the re-distribution wirings 105.

An sealing resin 203 composed of an epoxy resin is formed over the semiconductor substrate 101 except for the upper surfaces of the columnar electrodes 305.

The external terminals 201 composed of, for example, solder are formed on their corresponding upper surfaces of the columnar electrodes 305. As shown in FIG. 2, a plurality of the external terminals 201 are regularly disposed above the semiconductor substrate 101 at intervals A. In the WCSP shown in FIG. 2, the external terminals 201 are disposed in two rows.

After the formation of the electronic circuit, process steps up to the formation of the insulating layer 301 remain unchanged in the case of WCSP and QFP (Quad Flat Package). Namely, a wafer process and a circuit layout do not depend on the form of a package. Thus, it can be said that WCSP is a package capable of easily realizing downsizing of a semiconductor device.

Problems that the Invention is to Solve

It is however necessary to take into consideration the occurrence of the following problems where a high-frequency circuit is disposed in an area 107 indicated by diagonal lines in FIGS. 1 through 3.

The high-frequency circuit is a circuit for processing a signal having a relatively high frequency or a circuit for generating a signal having a relatively high frequency. As one example of the high-frequency circuit, there is known a voltage controlled oscillator (VCO: Voltage Controlled Oscillator) having such inductor elements (coils) 401 and 403 and capacitor elements 405 and 407 as shown in FIG. 4. The inductor elements and the capacitor elements are important elements for determining an oscillation frequency of the voltage controlled oscillator. When, for example, inductance values L of the inductor elements are varied, the oscillation frequency of the voltage controlled oscillator is varied.

As another example of the high-frequency circuit, there is known an RF circuit for processing a radio signal. The RF circuit includes, for example, an LNA circuit (Low Noise Amplifier) and a PA circuit (Power Amplifier). An inductor element for taking impedance matching with an external line or path is built in the RF circuit. The inductor element is also an important element for determining the characteristic of the RF circuit When, for example, unnecessary electromagnetic coupling is given to the inductor element or a parasitic inductor occurs, the matching of impedance between the RF circuit and the external line cannot be made, so that the characteristic of the RF circuit, e.g., an output characteristic of an antenna section will vary.

Re-distribution wirings 105, columnar electrodes 305 and external terminals 201 exist in the area 107. When the re-distribution wirings 105, columnar electrodes 305 and external terminals 201 are disposed within the area 107, the inductor element, the re-distribution wirings 105, the columnar electrodes 305 and the external terminals 201 disposed on the surface of the semiconductor substrate 101 in the area 107, for example, come close to one another in distance. Thus, electromagnetic coupling (or parasitic inductors or parasitic capacitors) are developed between the inductor element and each of the re-distribution wirings 105, between the inductor element and each of the columnar electrodes 305 and between the inductor element and each of the external terminals 201. Hence the characteristic of the inductor element, e.g., an inductance value L or a Q factor (Quality Factor), or the impedance varies. As a result, the oscillation frequency of the voltage controlled oscillator varies, or the characteristic (e.g., output characteristic of antenna section) of the RF circuit varies. Such a case is a case which is unlikely to take place in QFP in which no external terminals (leads) are disposed above the semiconductor substrate. Further, this is a case peculiar to a package like WCSP in which the external terminals are disposed above the semiconductor substrate.

Thus, a semiconductor device capable of suppressing a variation in high-frequency characteristic has been desired.

SUMMARY OF THE INVENTION

According to one aspect of the present invention, there is provided a semiconductor device that includes a semiconductor substrate having a main surface, the main surface including first and second areas formed with a high-frequency circuit element, and a third area located around the first and second areas and formed with a low-frequency circuit element. The semiconductor device also includes a sealing resin which covers the main surface; a plurality of first external terminals which are formed above the third area and which are electrically connected to the high-frequency circuit element, the first external terminals protruding from the surface of the sealing resin. The semiconductor device further includes a plurality of second external terminals which are formed above the third area and which are electrically connected to the low-frequency circuit element, the second external terminals protruding from the surface of the sealing resin.

DETAILED DESCRIPTION OF THE PREFERRED EMBODIMENTS

Figure 1:
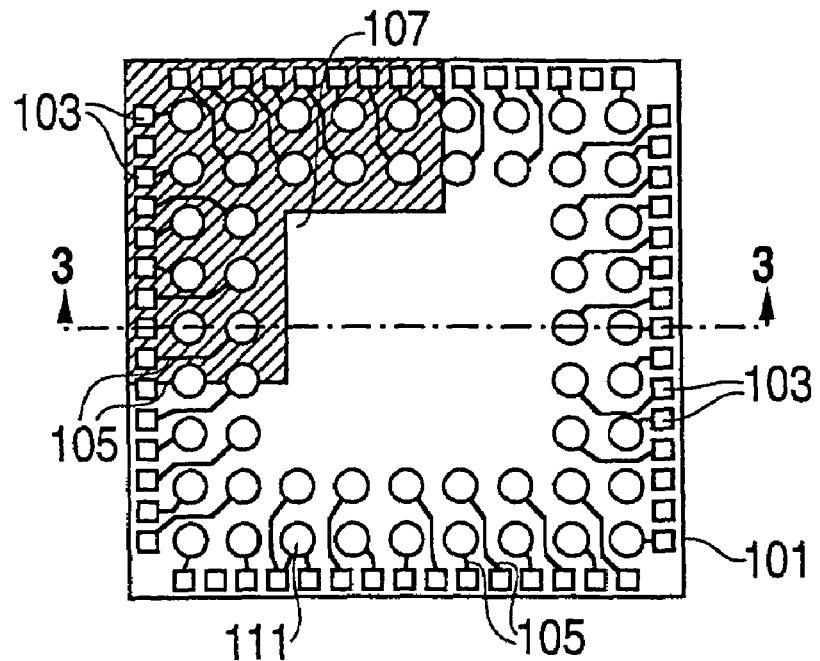
FIG. 1 is a plan view showing a conventional WCSP prior to being sealed with an sealing resin.
Figure 2:
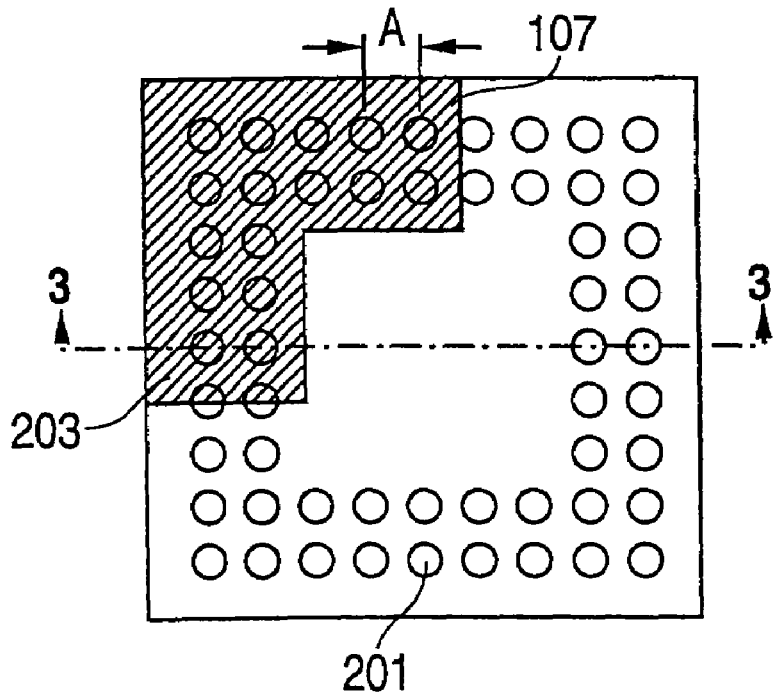
FIG. 2 is a plan view illustrating the conventional WCSP subsequent to having been sealed with the sealing resin.
Figure 3:
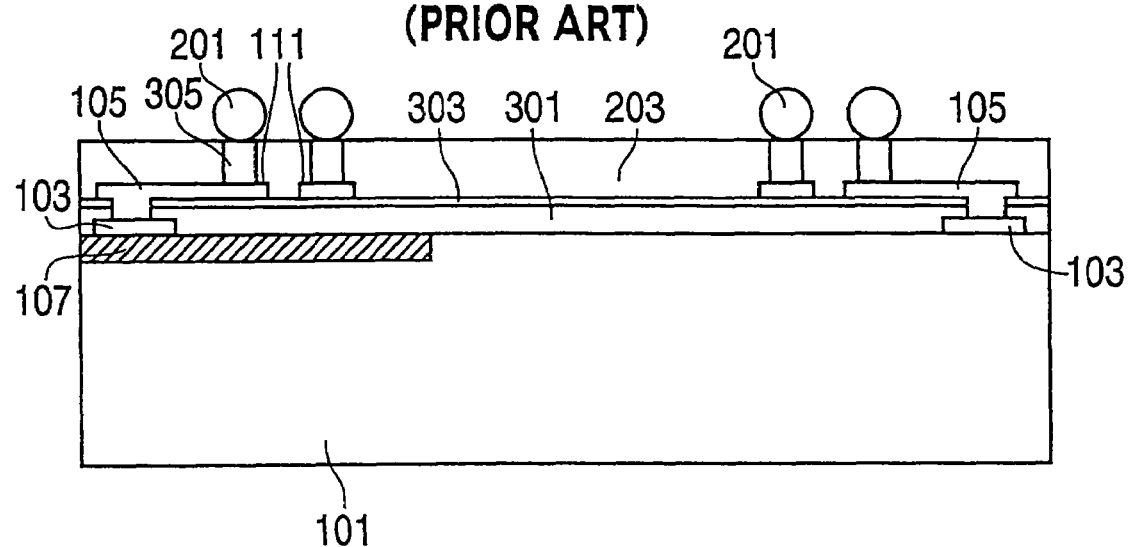
FIG. 3 is a schematic cross-sectional view taken along line 3-3 in each of FIGS. 1 and 2.
Figure 4:
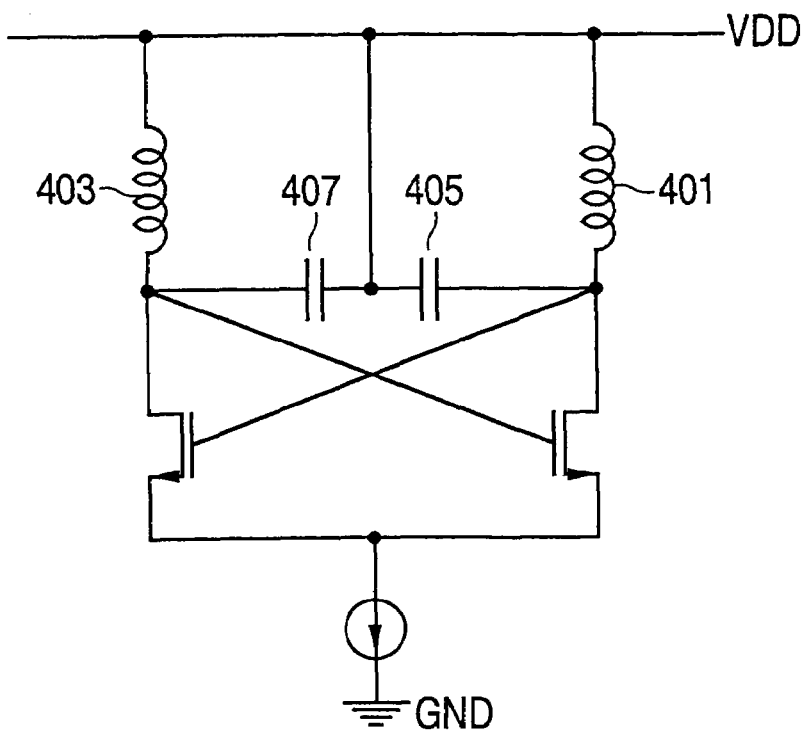
FIG. 4 is a circuit diagram showing a voltage controlled oscillator circuit.

A semiconductor device according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 5:
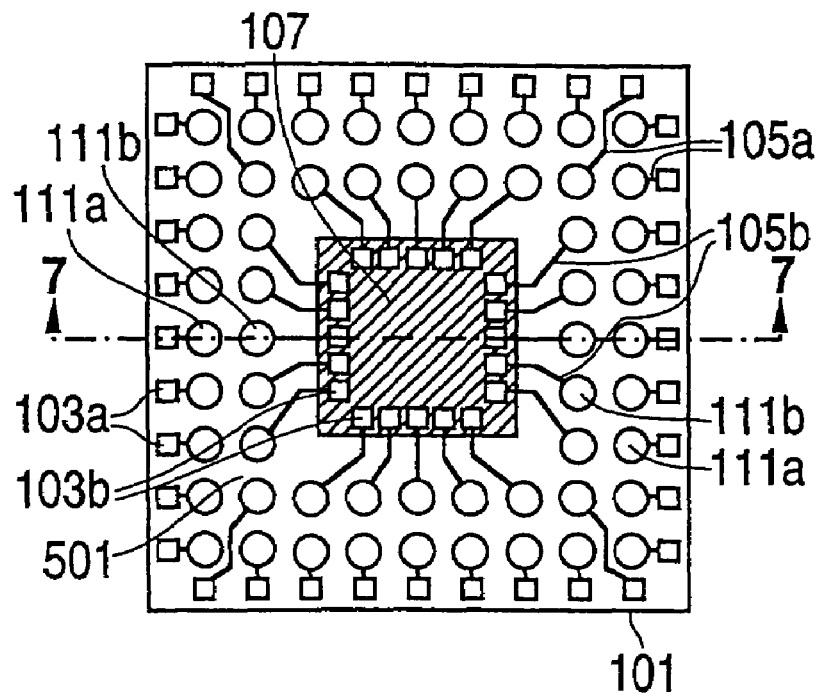
FIG. 5 is a plan view showing a semiconductor device according to a first embodiment of the present invention, prior to being sealed with an sealing resin.
Figure 6:
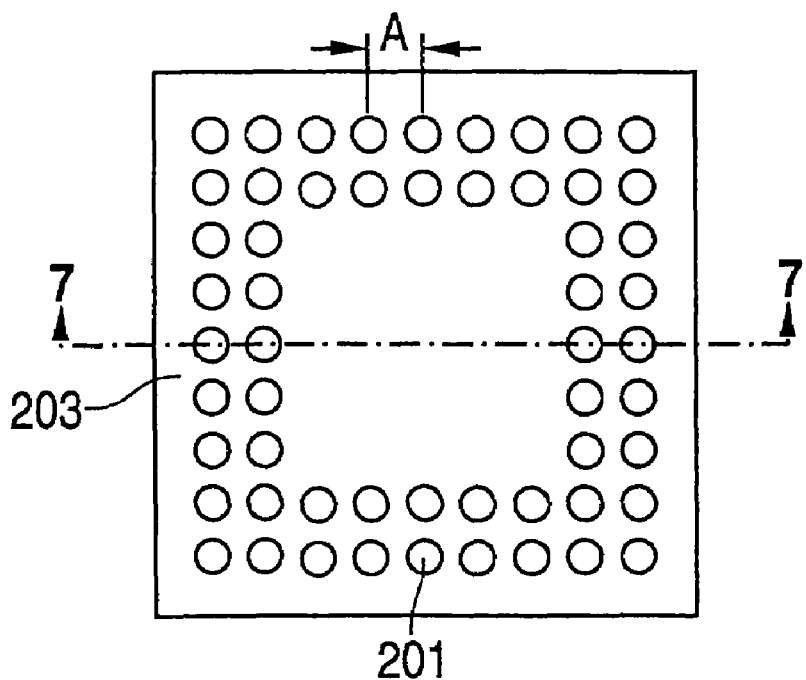
FIG. 6 is a plan view illustrating the semiconductor device according to the first embodiment of the present invention, subsequent to having been sealed with the sealing resin.
Figure 7:
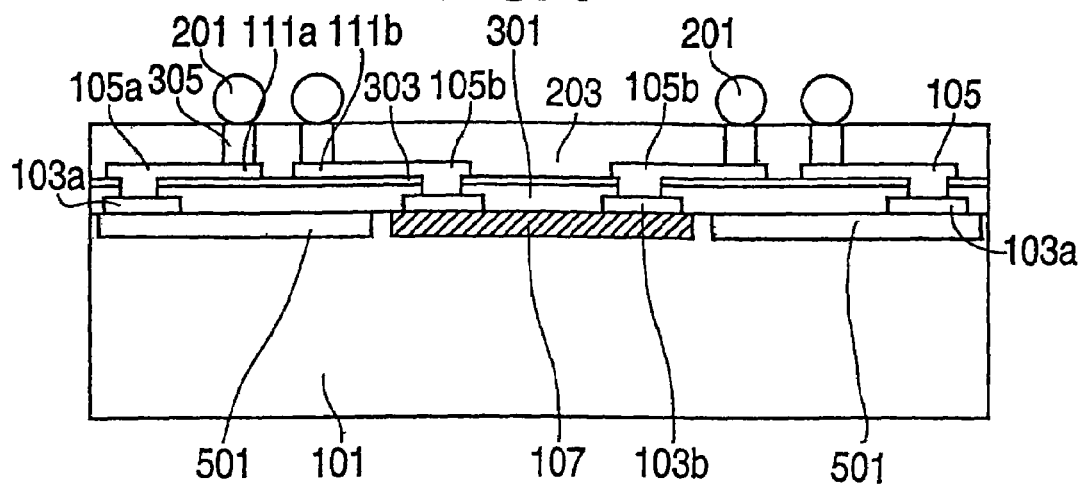
FIG. 7 is a schematic cross-sectional view taken along line 7-7 in each of FIGS. 5 and 6.

FIGS. 5 and 6 are respectively plan views showing a semiconductor device according to a first embodiment of the present invention. FIG. 5 is a plan view illustrating a state of the semiconductor device prior to being sealed with an sealing resin, and FIG. 6 is a plan view showing a state thereof subsequent to having been sealed with the sealing resin, respectively. FIG. 7 is a schematic cross-sectional view taken along line 7-7 in each of FIGS. 5 and 6.

The semiconductor device of the present invention has a semiconductor substrate 101. The semiconductor substrate 101 includes an area 107 (hereinafter called a high-frequency circuit area 107) in which a high-frequency circuit is mainly formed, and an area 501 (hereinafter called a low-frequency circuit area 501) in which a low-frequency circuit is mainly formed. The high-frequency circuit area 107 is a central area of the semiconductor substrate 101, whereas the low-frequency circuit area 501 is a peripheral area of the semiconductor substrate 101, which surrounds the central area. The high-frequency circuit is placed in the high-frequency circuit area 107, and the low-frequency circuit is placed in the low-frequency circuit area 501.

The high-frequency circuit is a circuit for processing a signal having a relatively high frequency or a circuit for generating a signal having a relatively high frequency. As one example of the high-frequency circuit, may be mentioned such a voltage controlled oscillator (VCO) as described previously, an RF circuit for processing a radio signal, or the like.

The low-frequency circuit is a circuit for processing a signal having a relatively low frequency or a circuit for generating a signal having a relatively low frequency.

A high frequency employed in the present specification indicates a frequency high relatively with respect to a low frequency, whereas a low frequency indicates a frequency low relatively with respect to a high frequency.

The high frequency employed in the present specification means a frequency lying within such a range that where the previously-described inductor element is illustrated by way of example, its characteristic will greatly change due to electromagnetic coupling or the occurrence of a parasitic element (parasitic inductor or parasitic capacitor). On the other hand, the low frequency employed in the present specification means a frequency lying within such a range that where the previously-described inductor element is illustrated by way of example, its characteristic will not vary so much even if the electromagnetic coupling occurs or the parasitic element occurs. Described specifically, the high frequency is supposed to be a band of 300 MHz or higher or radio frequencies. However, no particular limitation is imposed on such a numeral or the like from the above-described substance. On the other hand, described specifically, the low frequency is supposed to be a band lower than the above high-frequency band or an audio frequency. However, no particular limitation is imposed on such a numeral or the like from the above-described substance.

A plurality of electrode pads 103a to which at least one electronic circuit which processes a signal having a low frequency or at least one electronic circuit operated at a low frequency is connected, are formed on the surface of the semiconductor substrate 101 of the low-frequency circuit area 501. The electrode pads 103a are respectively composed of a material containing aluminum or a material containing gold and disposed in a peripheral area of the semiconductor substrate 101 in the low-frequency circuit area 501.

An insulating layer 301 composed of silicon oxide or the like is formed on the semiconductor substrate 101 excluding some of the surfaces of the electrode pads 103a and some of the surfaces of electrode pads 103b to be described later.

A protective film 303 composed of polyimide or the like is formed on the insulating layer 301.

Owing to such a structure, some of the electrode pads 103a and some of the electrode pads 103b are exposed by openings defined by the insulating layer 301 and the protective film 303.

One ends of wiring layers 105a composed of, for example, copper, are connected to their corresponding electrode pads 103a via the openings of the insulating layer 301. The wiring layers 105a extend over the protective film 303 so as to range from the electrode pads 103a to lower portions of columnar electrodes 305. The other ends of the wiring layers 105a are respectively pad portions 111a disposed below the columnar electrodes 305 and external terminals 201. The pad portions 111a are placed in positions near the central area of the semiconductor substrate 101 as viewed from the electrode pads 103a. Namely, the pad portions 111a are disposed above the low-frequency circuit area 501. The wiring layers 105a correspond to the previously-described re-distribution wirings, which will be called re-distribution wirings 105a below.

The columnar electrodes 305 composed of, for example, copper are respectively formed on the pad portions 111a of the re-distribution wirings 105a. The columnar electrodes 305 are also referred to as posts. A plurality of electrode pads 103b to which at least one electronic circuit which processes a signal having a high frequency or at least one electronic circuit operated at a high frequency is connected, are formed on the surface of the semiconductor substrate 101 of the high-frequency circuit area 107. The electrode pads 103b are respectively composed of a material containing aluminum or a material containing gold and disposed in a peripheral area of the high-frequency circuit area 107.

Some of the surfaces of the electrode pads 103b are exposed by the openings defined by the insulating layer 301 and the protective film 303.

One ends of wiring layers 105b are connected to their corresponding electrode pads 103b via the openings of the insulating layer 301. The wiring layers 105b extend over the protective film 303 so as to range from the electrode pads 103b to their corresponding lower portions of the columnar electrodes 305. The other ends of the wiring layers 105b are respectively pad portions 111b disposed below the columnar electrode 305 and external terminals 201. The pad portions 111b are placed in positions near the edges of the semiconductor substrate 101 as viewed from the electrode pads 103b. Namely, the pad portions 111b are disposed above the low-frequency circuit area 501. The wiring layers 105b correspond to the previously-described re-distribution wirings, which will be called re-distribution wirings 105b below.

The columnar electrodes 305 are respectively formed on the pad portions 111b of the re-distribution wirings 105b.

The external terminals 201 each composed of, for example, solder are formed on their corresponding upper surfaces of the columnar electrodes 305. As shown in FIG. 6, the external terminals 201 are regularly disposed above the semiconductor substrate 101 at intervals A. In such a structure as shown in FIG. 6, the external terminals 201 are disposed in two rows.

An sealing resin 203 composed of an epoxy resin is formed on the semiconductor substrate 101 excluding the upper surfaces of the columnar electrodes 305.

In the present embodiment, the external terminals 201 related to the low-frequency circuit are disposed above the low-frequency circuit area 501. Namely, each of the re-distribution wirings 105a for respectively connecting between the electrode pads 103a and the external terminals 201 has or takes a so-called Fan-In structure in regard to the low-frequency circuit.

On the other hand, the external terminals 201 related to the high-frequency circuit are disposed above the low-frequency circuit area 501 placed outside the high-frequency circuit area 107. Namely, each of the re-distribution wirings 105b for respectively connecting between the electrode pads 103b and the external terminals 201 takes a so-called Fan-Out structure in regard to the high-frequency circuit.

In the present embodiment, the high-frequency circuit is placed in the central area of the semiconductor substrate 101, whereas the low-frequency circuit is placed in the peripheral area that surrounds the central area. Further, the external terminals 201 related to the high-frequency circuit are disposed outside the high-frequency circuit area 107. The re-distribution wirings 105b related to the high-frequency circuit are formed in such a manner that the external terminals 201 related to the high-frequency circuit are located outside the high-frequency circuit area 107 (each of the re-distribution wirings 105b related to the high-frequency circuit takes the Fan-Out structure).

Namely, since the re-distribution wirings 105b, the columnar electrodes 305 and the external terminals 201 are not disposed directly over (above) the high-frequency circuit formed in the high-frequency circuit area 107 in the present embodiment, the distance between the high-frequency circuit and each of the re-distribution wiring 105b, the columnar electrode 305 and the external terminal 201 becomes longer than ever. Thus, electromagnetic coupling developed between the high-frequency circuit and each re-distribution wiring 105b or the like, or a variation in characteristic of the high-frequency circuit due to the parasitic element can be suppressed.

In the present specification, the term that "no external terminals 201 are disposed directly over (above) the high-frequency circuit" means that the external terminals 201 do not overlap with the high-frequency circuit as viewed on a plane basis. In other words, the external terminals 201 do not overlap with the high-frequency circuit as viewed from above the semiconductor device.

Similarly, the term that "the re-distribution wirings 105 are not disposed directly over (above) the high-frequency circuit" means that the re-distribution wirings 105 do not overlap with the high-frequency circuit as viewed on a plane basis. In other words, the high-frequency circuit is not superimposed on an inductor element (such as element 1101 in FIG. 11) as viewed from above the semiconductor device.

Further, similarly, the term that "no columnar electrodes 305 are disposed directly over (above) the high-frequency circuit", means that the columnar electrodes 305 do not overlap with the high-frequency circuit as viewed on a plane basis. In other words, the columnar electrodes 305 are not superimposed on the high-frequency circuit as viewed from above the semiconductor device.

Incidentally, while each of the re-distribution wirings 105a related to the low-frequency circuit has been described as the Fan-In structure in the present embodiment, it may be configured as the Fan-Out structure. Namely, the present embodiment may adopt such a structure that the re-distribution wirings 105, the columnar electrodes 305 and the external terminals 201 are not disposed directly over (above) the high-frequency circuit formed in the high-frequency circuit area 107.

Second Preferred Embodiment

A second embodiment of a semiconductor device according to the present invention will next be described below with reference to the accompanying drawings.

Figure 8:
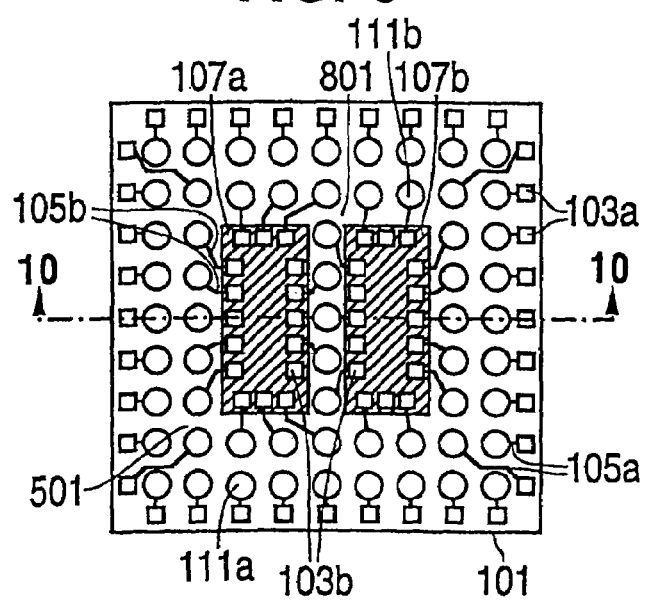
FIG. 8 is a plan view showing a semiconductor device according to a second embodiment of the present invention, prior to being sealed with an sealing resin.
Figure 9:
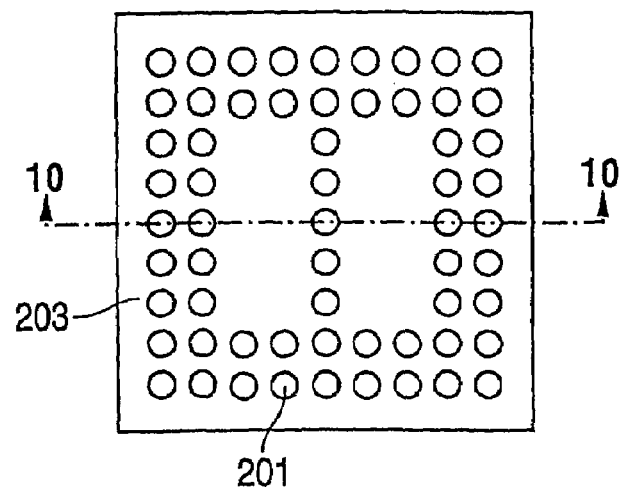
FIG. 9 is a plan view illustrating the semiconductor device according to the second embodiment of the present invention, subsequent to having been sealed with the sealing resin.
Figure 10:
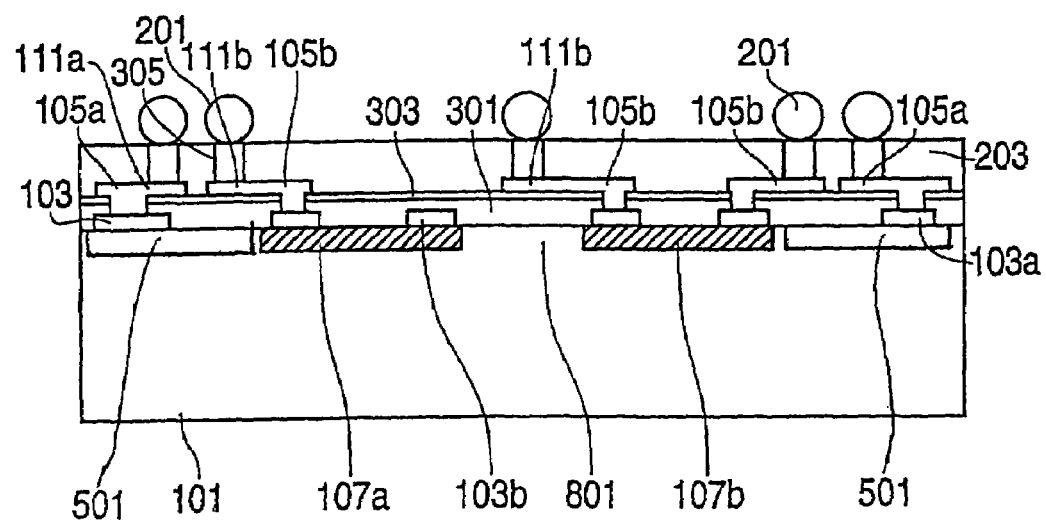
FIG. 10 is a schematic cross-sectional view taken along line 10-10 in each of FIGS. 8 and 9.

FIGS. 8 and 9 are respectively plan views showing the semiconductor device according to the second embodiment of the present invention. FIG. 8 is a plan view showing a state of the semiconductor device prior to being sealed with an sealing resin, and FIG. 9 is a plan view showing a state thereof subsequent to having been sealed with the sealing resin, respectively. FIG. 10 is a schematic cross-sectional view taken along line 10-10 in each of FIGS. 8 and 9.

A great difference between the second embodiment and the first embodiment resides in that a high-frequency circuit area 107 formed with a high-frequency circuit is divided into plural forms.

The semiconductor device according to the present invention has a semiconductor substrate 101. High-frequency circuit areas 107a and 107b each mainly formed with a high-frequency circuit, and a low-frequency circuit area 501 and an external terminal layout area 801 each mainly formed with a low-frequency circuit exist in the semiconductor substrate 101.

The external terminal layout area 801 is an area which is located in a central portion of the semiconductor substrate 101 and in which external terminals 201 of one row are disposed thereabove.

The high-frequency circuit area 107a and the high-frequency circuit area 107b exist within the central area of the semiconductor substrate 101 with the external terminal layout area 801 interposed therebetween.

The high-frequency circuit is disposed in each of the high-frequency circuit areas 107, and the low-frequency circuit is disposed in the low-frequency circuit area 501. While there may be a case in which the low-frequency circuit is disposed in the external terminal layout area 801, the external terminal layout area 801 will be described as an area for disposing columnar electrodes 305 and external terminals 201 thereabove in the present embodiment.

A plurality of electrode pads 103a to which at least one electronic circuit which processes a signal having a low frequency or at least one electronic circuit operated at a low frequency is connected, are formed on the surface of the semiconductor substrate 101 of the low-frequency circuit area 501. The electrode pads 103a are respectively composed of a material containing aluminum or a material containing gold and disposed in a peripheral area of the semiconductor substrate 101 in the low-frequency circuit area 501.

An insulating layer 301 composed of silicon oxide or the like is formed on the semiconductor substrate 101 excluding some of the surfaces of the electrode pads 103a and some of the surfaces of electrode pads 103b to be described later.

A protective film 303 made up of polyimide or the like is formed on the insulating layer 301.

Owing to such a structure, some of the electrode pads 103a and some of the electrode pads 103b are exposed by openings defined by the insulating layer 301 and the protective film 303.

One ends of re-distribution wirings 105a composed of, for example, copper, are connected to their corresponding electrode pads 103a via the openings of the insulating layer 301. The re-distribution wirings 105a extend over the protective film 303 so as to range from the electrode pads 103a to lower portions of the columnar electrodes 305. The other ends of the re-distribution wirings 105a are respectively pad portions 111a disposed below the columnar electrodes 305 and external terminals 201. The pad portions 111a are placed in positions near the central area of the semiconductor substrate 101 as viewed from the electrode pads 103a. Namely the pad portions 111a are disposed above the low-frequency circuit area 501.

The columnar electrodes 305 composed of, for example, copper are respectively formed on the pad portions 111a of the re-distribution wirings 105a.

The electrode pads 103b to which electronic circuits each of which processes a signal having a high frequency or electronic circuits each operated at a high frequency, are formed on the surface of the semiconductor substrate 101 of the high-frequency circuit areas 107a and 107b. The electrode pads 103b are respectively composed of a material containing aluminum or a material containing gold and disposed in peripheral areas of the high-frequency circuit areas 107a and 107b.

Some of the surfaces of the electrode pads 103b are exposed by the openings defined by the insulating layer 301 and the protective film 303.

One ends of re-distribution wirings 105b are connected to their corresponding electrode pads 103b via the openings of the insulating layer 301. The re-distribution wirings 105b extend over the protective film 303 so as to range from the electrode pads 103b to their corresponding lower portions of the columnar electrodes 305. The other ends of the re-distribution wirings 105b are respectively pad portions 111b disposed below the columnar electrodes 305 and external terminals 201.

As shown in FIGS. 8 and 10, the pad portions 111b located above the external terminal layout area 801 are disposed between the high-frequency circuit area 107a and the high-frequency circuit area 107b. Other pad portions 111b are disposed in positions near the edges of the semiconductor substrate 101 as seen from the electrode pads 103b in a manner similar to the first embodiment. However, the present embodiment is in common with the first embodiment in configuration in that all of the pad portions 111 are disposed over the low-frequency circuit area 501 (including the external terminal layout area 801).

The columnar electrodes 305 are respectively formed on the pad portions 111b of the re-distribution wirings 105b.

The external terminals 201 composed of, for example, solder are formed on their corresponding upper surfaces of the columnar electrodes 305.

An sealing resin 203 composed of an epoxy resin is formed over the semiconductor substrate 101 excluding the upper surfaces of the columnar electrodes 305.

In the present embodiment, the external terminals 201 related to the low-frequency circuit are disposed above the low-frequency circuit area 501. Namely, each of the re-distribution wirings 105a for respectively connecting between the electrode pads 103a and the external terminals 201 takes a so-called Fan-In structure in regard to the low-frequency circuit.

On the other hand, the external terminals 201 related to the high-frequency circuit are disposed above the low-frequency circuit area 501 placed outside the high-frequency circuit areas 107 and above the external terminal layout area 801. Namely, each of the re-distribution wirings 105b for respectively connecting between the electrode pads 103b and the external terminals 201 takes a so-called Fan-Out structure in regard to the high-frequency circuit.

In the present embodiment, the high-frequency circuits are disposed in a divided form in the central area of the semiconductor substrate 101, and the low-frequency circuit is disposed in the peripheral area that surrounds the central area. Further, the external terminals 201 related to the respective high-frequency circuits are disposed outside the respective high-frequency circuit areas 107a and 107b. The re-distribution wirings 105b related to each high-frequency circuit are formed in such a manner that the external terminals 201 related to each high-frequency circuit are located outside each of the high-frequency circuit areas 107 (each of the re-distribution wirings 105b related to the high-frequency circuits takes the Fan-Out structure).

Namely, since the re-distribution wirings 105b, the columnar electrodes 305 and the external terminals 201 are not disposed directly over (above) the high-frequency circuits formed in the high-frequency circuit areas 107a and 107b in the present embodiment, the distance between each of the high-frequency circuits and each of the re-distribution wiring 105b, the columnar electrode 305 and the external terminal 201 becomes longer than ever. Thus, electromagnetic coupling developed between the high-frequency circuit and each re-distribution wiring 105b or the like, and a variation in characteristic of each high-frequency circuit due to a parasitic element can be suppressed.

Further, since the high-frequency circuit areas are divided and disposed in plural form and the external terminal layout area is provided between the divided high-frequency circuit areas in the present embodiment, the more external terminals can be provided as compared with the first embodiment.

Incidentally, while each of the re-distribution wirings 105a related to the low-frequency circuit has been described as the Fan-In structure even in the present embodiment, it may take the Fan-Out structure. Namely, such a structure that the re-distribution wirings 105b, the columnar electrodes 305 and the external terminals 201 are not disposed directly over (above) the high-frequency circuits formed in the high-frequency circuit areas 107a and 107b, may be adopted in the present embodiment

Third Preferred Embodiment

A third embodiment of a semiconductor device according to the present invention will next be described below with reference to the accompanying drawings.

Figure 11:
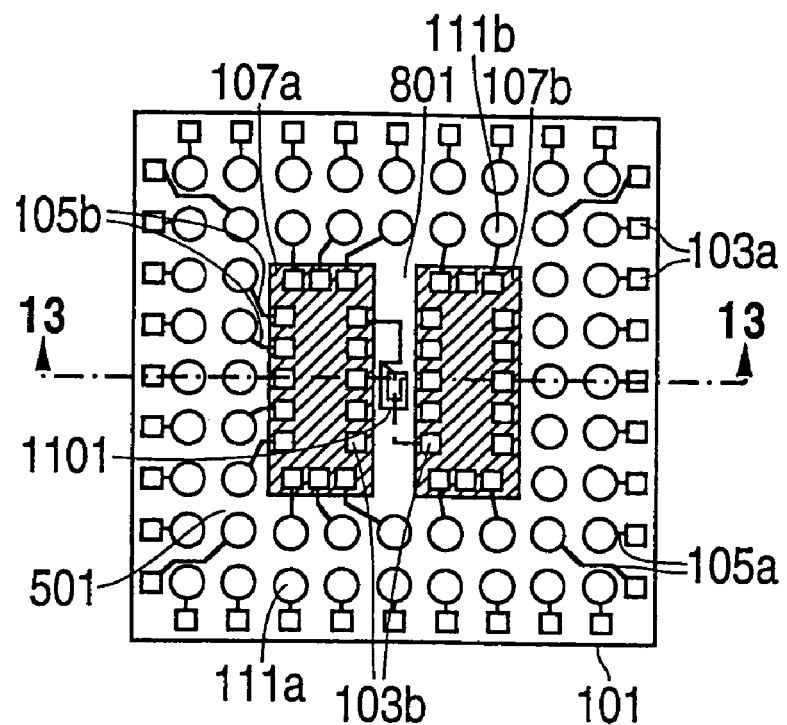
FIG. 11 is a plan view showing a semiconductor device according to a third embodiment of the present invention, prior to being sealed with an sealing resin.
Figure 12:
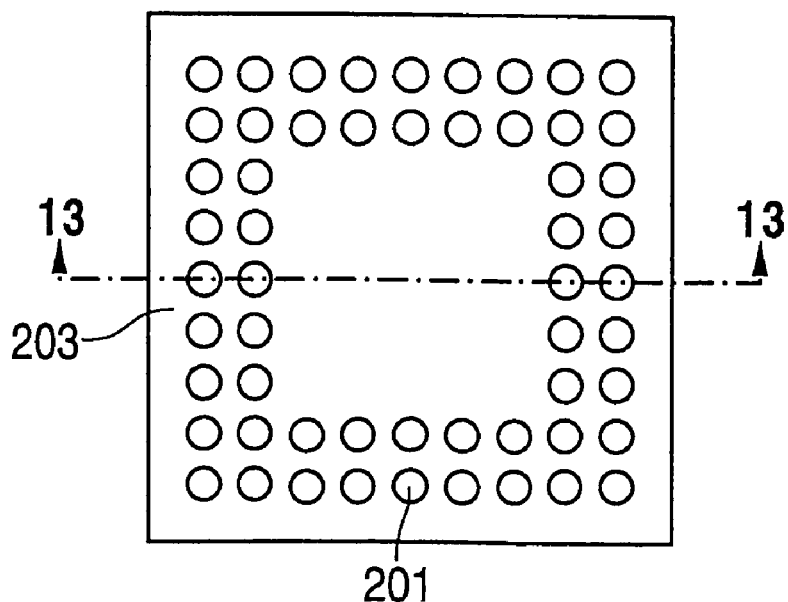
FIG. 12 is a plan view illustrating the semiconductor device according to the third embodiment of the present invention, subsequent to having been sealed with the sealing resin.
Figure 13:
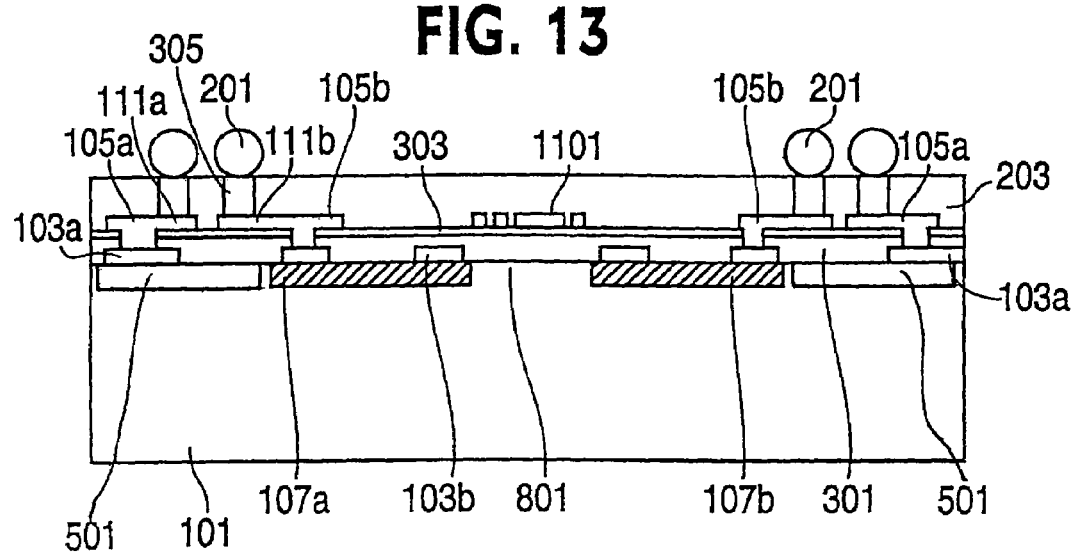
FIG. 13 is a schematic cross-sectional view taken alone line 13-13 in each of FIGS. 11 and 12.

FIGS. 11 and 12 are respectively plan views showing the semiconductor device according to the third embodiment of the present invention. FIG. 11 is a plan view showing a state of the semiconductor device prior to being sealed with an sealing resin, and FIG. 12 is a plan view showing a state thereof subsequent to having been sealed with the sealing resin, respectively. FIG. 13 is a schematic cross-sectional view taken along line 13-13 in each of FIGS. 11 and 12.

A great difference between the third embodiment and the second embodiment resides in that a spiral inductor 1101 is formed between a high-frequency circuit area 107a and a high-frequency circuit area 107b, i.e., above an external terminal layout area 801. As described above, the inductor element has also been described as part of elements that constitute each high-frequency circuit in the present specification. Accordingly, in the present embodiment, the external terminal layout area 801 is defined as a high-frequency area in which the corresponding high-frequency circuit is substantially disposed.

The spiral inductor 1101 is electrically connected between electrode pads 103b in the high-frequency circuit area 107a and electrode pads 103b in the high-frequency circuit area 107b. Further, the spiral inductor 1101 is composed of the same material as re-distribution wirings 105a and 105b and formed on a protective film 303 lying over the external terminal layout area 801 substantially simultaneously with the re-distribution wirings 105a and 105b. Since the third embodiment is substantially similar in other configuration to the second embodiment, its detailed description will be omitted.

According to the present embodiment, the spiral inductor 1101, which functions as the inductor element, is not formed on the surface of the semiconductor substrate 101 but formed on the protective film 303 for covering the surface of the semiconductor substrate 101. More described specifically, the inductor element (spiral inductor 1101) is configured by use of each re-distribution wiring itself having the potential for causing electromagnetic coupling between the re-distribution wiring and the inductor element in the conventional configuration. Thus, according to the present embodiment, an advantageous effect is brought about in addition to that of the second embodiment in that it is unnecessary to take into consideration the distance between an object (re-distribution wiring) corresponding to one of factors that will cause the electromagnetic coupling and the parasitic element, and its corresponding inductor element.

Fourth Preferred Embodiment

A fourth embodiment each illustrative of semiconductor devices according to the present invention will next be described below with reference to the accompanying drawings.

The reason why a structure of the present embodiment is adopted, will first be described below.

When an inductor element 1101 is disposed on the surface of a semiconductor substrate 101, the inductor element 1101 and its corresponding electrode pad 103 are connected to each other by a wiring (which is not a re-distribution wiring) having a predetermined length. Only a predetermined inductance L included in an inductor element may preferably be used as the inductance L of the inductor element. Thus, the distance between the corresponding electrode pad 103 and the inductor element 1101, i.e., the length of a wiring for connecting between the inductor element 1101 and the electrode pad 103 may be set as short as possible. Owing to the adoption of such a structure of the first embodiment as shown in FIG. 5 by way of example, the length of the above wiring can be shortened while a variation in high-frequency characteristic is being suppressed. However, when such a structure is adopted, there is a need to perform a substantial design change of from a position and circuit layout of each electrode pad designed with QFP as a premise to a circuit layout with WCSP as a premise. Accordingly, the present embodiment provides semiconductor devices adapted for different package forms (e.g., QFP and WCSP).

Figure 14:
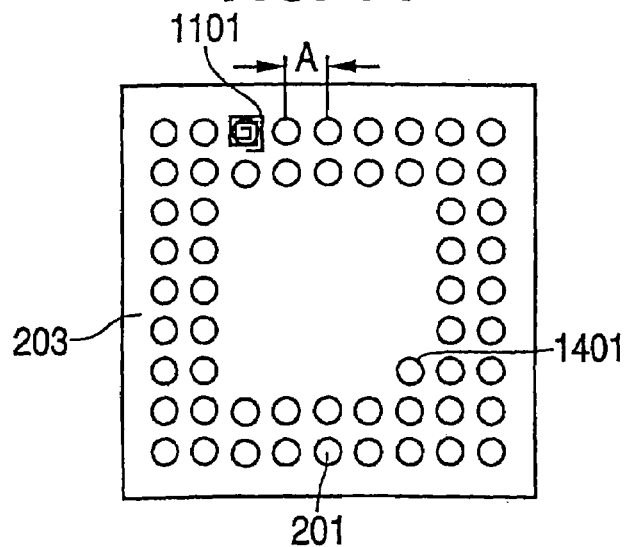
FIG. 14 is a plan perspective view showing a semiconductor device according to a fourth embodiment of the present invention.
Figure 15:
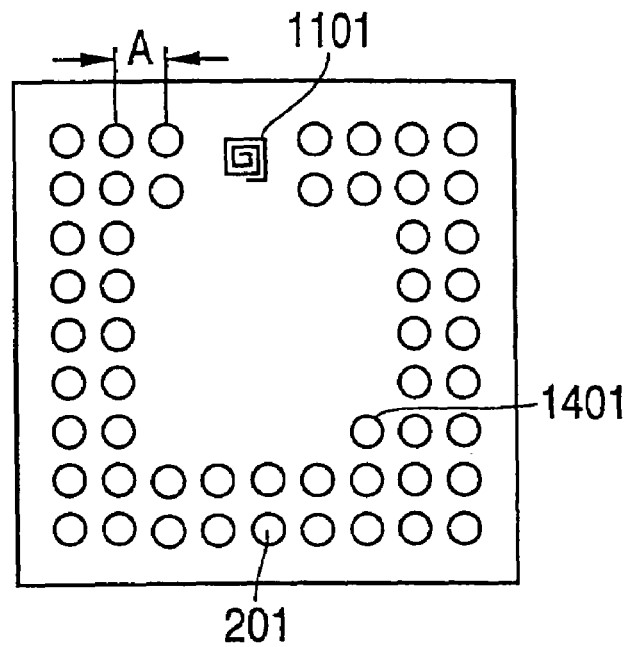
FIG. 15 is a plan perspective view illustrating a semiconductor device according to the fourth embodiment of the present invention.
Figure 16:
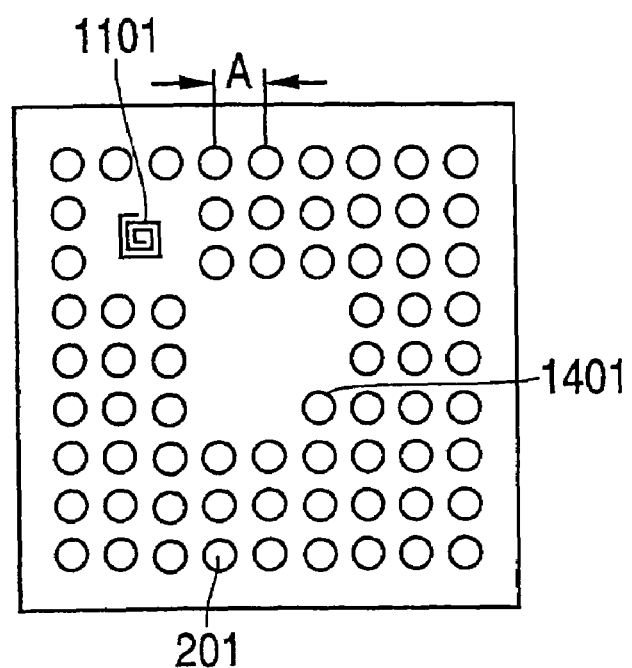
FIG. 16 is a plan perspective view depicting a semiconductor device according to the fourth embodiment of the present invention.

FIGS. 14 through 16 are respectively plan perspective views showing semiconductor devices according to the fourth embodiment of the present invention. In FIGS. 14 through 16, illustrations of electrode pads 103 and re-distribution wirings 105 are omitted. Since external terminals 201 are respectively located over sealing resins 203, they are indicated by dotted lines respectively. Index marks 1401 for indicating the directions of packages are disposed in the present embodiment. In the present embodiment, each of the inductor elements 1101 is formed over the surface of the semiconductor substrate 101, i.e., below the re-distribution wirings 105.

The semiconductor device shown in FIG. 14 has a plurality of the external terminals 201 disposed in a peripheral area of the semiconductor device. Further, these plural external terminals 201 are substantially regularly disposed in two rows and at intervals A. However, one external terminal 201 to be originally disposed is not disposed directly over (above) an area in which the inductor element 1101 is formed. In this type of semiconductor device, all the external terminals 201 are not utilized as terminals electrically connected to external circuits on a motherboard. Such terminals are referred to as "so-called non-connect terminals (also called "NC pins")). In general, a couple of such non-connect terminals are prepared for one semiconductor device. The number of the non-connect terminals is normally less than or equal to 20 percent of the total number of external terminals.

In the present embodiment, the inductor element 1101 is disposed in, for example, a position where each of external terminals corresponding to the non-connect terminals is to be disposed. Such a structure is common to FIGS. 14 to 16. Incidentally, although not illustrated in the drawing, neither the re-distribution wiring 105 nor the columnar electrode 305 is disposed directly over (above) the area formed with the inductor element 1101.

The semiconductor device shown in FIG. 15 has a plurality of the external terminals 201 disposed in a peripheral area of the semiconductor device. Further, these plural external terminals 201 are substantially regularly disposed in two rows and at intervals A. However, the four external terminals 201 to be originally disposed are not disposed directly over (above) and in the vicinity of an area in which the inductor element 1101 is formed. Incidentally, although not illustrated in the drawing, neither re-distribution wirings 105 nor columnar electrodes 305 are disposed directly over (above) and in the vicinity of the area in which the inductor element 1101 is formed.

The semiconductor device shown in FIG. 16 has a plurality of the external terminals 201 disposed in a peripheral area of the semiconductor device. Further, these plural external terminals 201 are substantially regularly disposed in three rows and at intervals A. However, the four external terminals 201 to be originally disposed are not disposed directly over (above) and in the neighborhood of an area in which the inductor element 1101 is formed. Incidentally, although not illustrated in the drawing, neither re-distribution wirings 105 nor columnar electrodes 305 are disposed directly over (above) and in the vicinity of the area in which the inductor element 1101 is formed.

In the present embodiment, the term that "no external terminal 201 is disposed directly over (above) the inductor element 1101", means that the external terminal 201 do not overlap with the inductor element 1101 as viewed on a plane basis. In other words, the external terminal 201 does not overlap with the inductor element 1101 as viewed from above the semiconductor device.

Similarly, the term that "no re-distribution wiring 105 is disposed directly over (above) the inductor element 1101", means that the re-distribution wiring 105 do not overlap with the inductor element 1101 as viewed on a plane basis. In other words, the re-distribution wiring 105 is not superimposed on the inductor element 1101 from above the semiconductor element.

Further, similarly, the term that "no columnar electrode 305 is disposed directly over (above) the inductor element 1101", means that the columnar electrode 305 do not overlap with the inductor element 1101 as viewed on a plane basis. In other words, the columnar electrode 305 is not superimposed on the inductor element 1101 from above the semiconductor device.

According to the present embodiment, since there is adopted such a structure that the re-distribution wirings 105, columnar electrodes 305 and external terminals 201 are not disposed directly over (above) the inductor element 1101, the distance between the inductor element 1101 and each of the re-distribution wiring 105, columnar electrode 305 and external terminal 201 is longer than ever. It is thus possible to suppress electromagnetic coupling developed between the inductor element and the re-distribution wiring 105 or the like, or a variation in characteristic of a high-frequency circuit due to a parasitic element.

Further, according to the present embodiment, WCSP can be provided without changing the position and circuit layout of each electrode pad designed with QFP as a premise, for example. Thus, the present embodiment can provide semiconductor devices adapted for different package forms (e.g., QFP and WCSP).

Fifth Preferred Embodiment

A fifth embodiment of a semiconductor device according to the present invention will next be described below with reference to the accompanying drawings. The present embodiment is one in which the above-described technical idea of the present invention is applied to a fine pitch ball grid array package (FPBGA).

Figure 17:
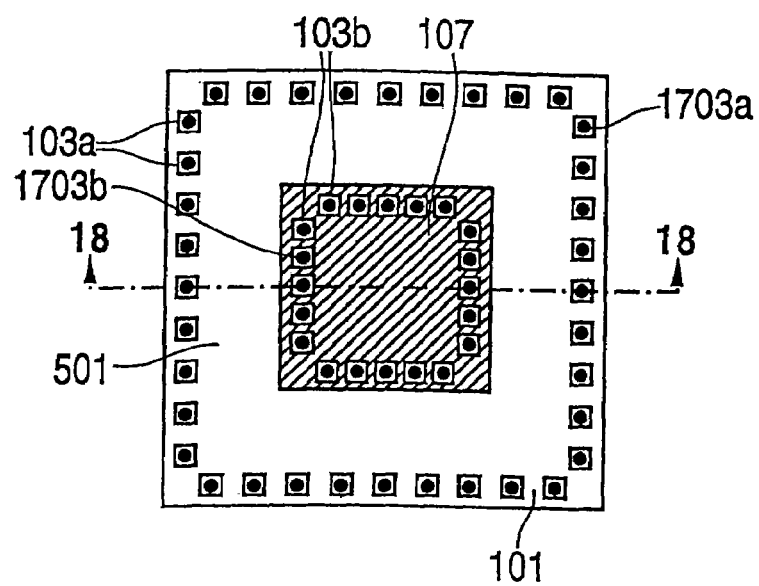
FIG. 17 is a plan view showing a semiconductor substrate 101 according to a fifth embodiment of the present invention.
Figure 18:
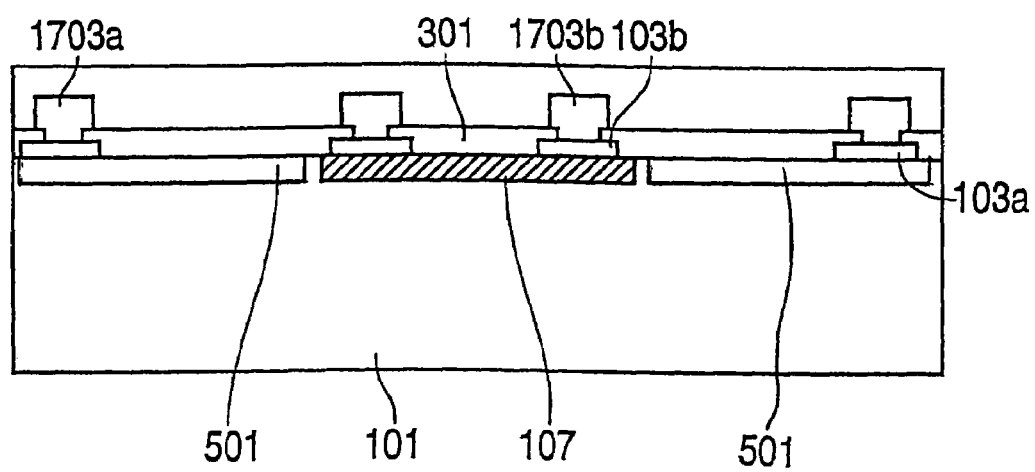
FIG. 18 is a schematic cross-sectional view taken along line 18-18 in FIG. 17.
Figure 19:
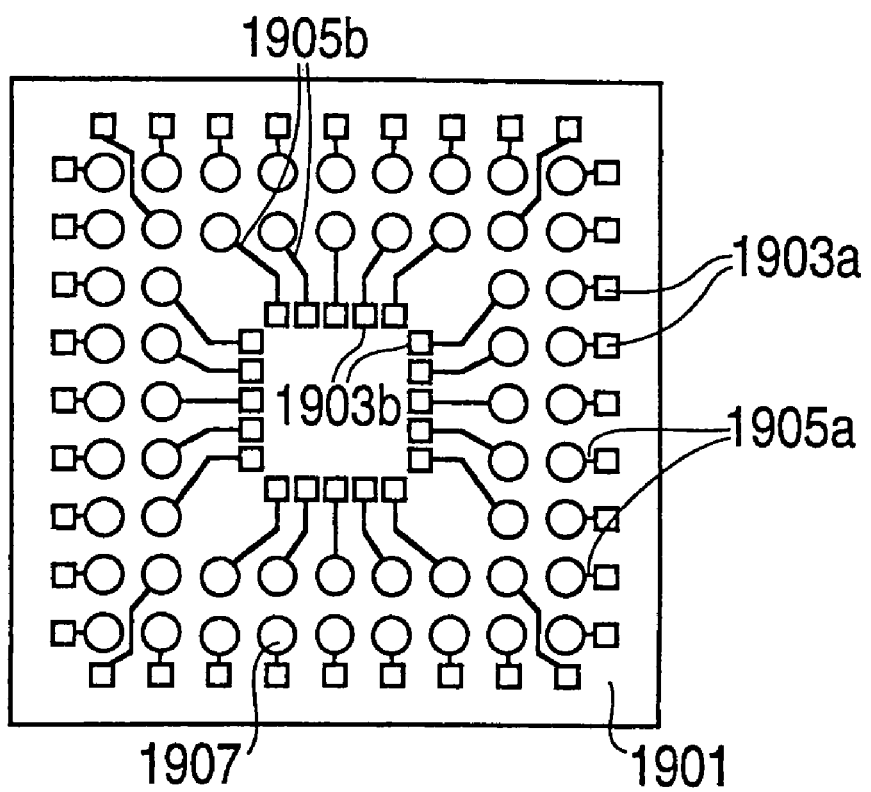
FIG. 19 is a plan view showing an interposer 1901 illustrated in the fifth embodiment of the present invention.
Figure 20:
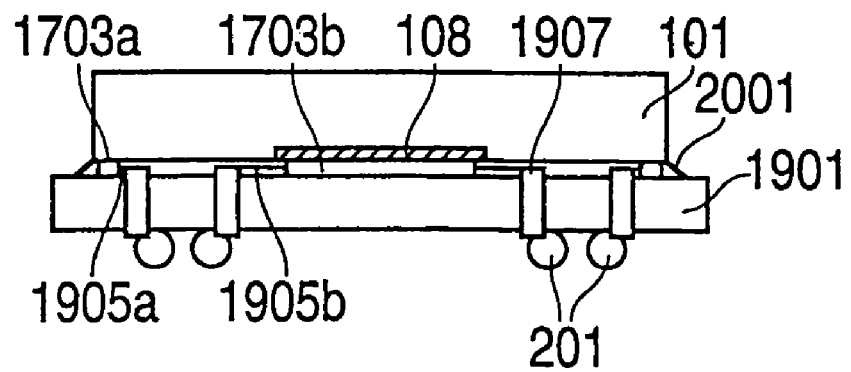
FIG. 20 is a schematic cross-sectional view illustrating a semiconductor device according to the fifth embodiment of the present invention

FIG. 17 is a plan view showing a semiconductor substrate 101 illustrated in the present embodiment, and FIG. 18 is a schematic cross-sectional view taken along line 18-18 of FIG. 17, respectively. FIG. 19 is a plan view showing an interposer 1901 (also called a wiring board) illustrated in the present embodiment, and FIG. 20 is a schematic cross-sectional view showing the semiconductor device according to the present embodiment, respectively.

As shown in FIGS. 17 and 18, the difference between the semiconductor substrate 1101 illustrated in the fifth embodiment and the semiconductor substrate 101 illustrated in the first embodiment resides in that bump electrodes 1703a and 1703b are respectively formed on electrode pads 103a for a low-frequency circuit and electrode pads 103b for a high-frequency circuit. These bump electrodes 1703a and 1703b are respectively composed of, for example, solder or gold.

The bump electrodes 1703a are respectively connected to pads 1903a formed on the surface of the interposer 1901, whereas the bump electrodes 1703b are respectively connected to pads 1903b formed on the surface of the interposer 1901. Namely, the semiconductor substrate 101 is face-down mounted onto the surface of the interposer 1901.

The interposer 1901 is made up of, for example, ceramic, glass epoxy or a tape-shaped material. The interposer 1901 has the pads 1903a, pads 1903b, through hole portions 1907, wirings 1905a and wirings 1905b provided on the surface thereof.

The pads 1903a are connected to the through hole portions 1907 via the wirings 1905a respectively, and the pads 1903b are connected to the through hole portions 1907 via the wirings 1905b.

As shown in FIG. 20, a plurality of lands connected to the through hole portions 1907 are formed on the back of the interposer 1901, and external terminals 201 are disposed on these lands.

A resin 2001 is inserted into a space defined between the semiconductor substrate 101 and the interposer 1901.

In the present embodiment, the external terminals 201 related to the low-frequency circuit are disposed above an area 501 for the low-frequency circuit. Namely, each of the wirings 1905a formed on the interposer 1901, for connecting between the electrode pads 103a and the external terminals 201 has a so-called Fun-In structure in regard to the low-frequency circuit.

On the other hand, the external terminals 201 related to the high-frequency circuit are disposed above the low-frequency circuit area 501 disposed outside a high-frequency circuit area 107. Namely, each of the wirings 1905b formed on the interposer 1901, for connecting between the electrode pads 103b and the external terminals 201 takes a so-called Fan-Out structure.

Namely, since the wirings 1905b and the external terminals 201 are not disposed directly over (above) the high-frequency circuit formed in the high-frequency circuit area 107 in the present embodiment, the distance between the high-frequency circuit and each of the wiring 1905b and the external terminal 201 can be made long. Thus, electromagnetic coupling developed between the high-frequency circuit and each wiring 1905b or the like, or a variation in characteristic of the high-frequency circuit due to a parasitic element can be suppressed.

Advantages obtained by a typical semiconductor device of the inventions disclosed in the present application will be described in brief as follows:

According to the semiconductor device of the present invention, a high-frequency circuit element is disposed in a first area (high-frequency circuit area), and a low-frequency circuit element is disposed in a second area (low-frequency circuit area) around the first area, and external terminals related to the high-frequency circuit element are disposed on the second area.

According to the semiconductor device of the present invention, since the external terminals are not disposed directly over (above) a high-frequency circuit formed in the first area, the distance between the high-frequency circuit and each of the external terminals becomes longer than ever. It is thus possible to suppress electromagnetic coupling developed between the high-frequency circuit and the external terminal or a variation in characteristic of the high-frequency circuit due to a parasitic element.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device, comprising:
   a semiconductor substrate having a main surface, the main surface includes first and a second areas each formed with a high-frequency circuit element, and includes a third area located around the first and second areas and formed with a low-frequency circuit element;
   a sealing resin which covers the main surface;
   a plurality of first external terminals which are formed above the third area and which are electrically connected to the high-frequency circuit element, said first external terminals protruding from the surface of the sealing resin; and
   a plurality of second external terminals which are formed above the third area and which are electrically connected to the low-frequency circuit element, said second external terminals protruding from the surface of the sealing resin.

2. The semiconductor device according to claim 1, further comprising:
   first electrode pads which are formed in the first and second areas, and which are electrically connected to the high-frequency circuit element;
   second electrode pads which are formed in the third area, and which are electrically connected to the low-frequency circuit element;
   an insulating film which is formed on the main surface so as to expose portions of surfaces of the first electrode pads and portions of surfaces of the second electrode pads;
   first wirings which are formed on the insulating film and which electrically connect the first electrode pads to the first external terminals; and
   second wirings which are formed on the insulating film and which electrically connect the second electrode pads to the second external terminals.

3. The semiconductor device according to claim 2, wherein the first electrode pads are formed in an area around the first and second areas.

4. The semiconductor device according to claim 3, wherein the third area is located in a peripheral area of the semiconductor substrate and is located in an area between the first and second areas.

5. The semiconductor device according to claim 4, wherein the first external terminals are disposed above the third area.

6. The semiconductor device according to claim 1, wherein the first external terminals and the second external terminals are substantially regularly disposed at predetermined intervals.

7. The semiconductor device according to claim 1, wherein the high-frequency circuit element includes an inductor element.

8. The semiconductor device according to claim 1, wherein the first external terminals and the second external terminals are formed only above the third area.

9. The semiconductor device according to claims , wherein a frequency supplied to the high-frequency circuit element and a frequency processed by the high-frequency circuit element are radio frequencies.

* * * * *